US009048170B2

(12) United States Patent
Pfister et al.

(10) Patent No.: US 9,048,170 B2
(45) Date of Patent: *Jun. 2, 2015

(54) METHOD OF FABRICATING OPTICAL DEVICES USING LASER TREATMENT

(75) Inventors: Nicholas J. Pfister, Goleta, CA (US); James W. Raring, Goleta, CA (US); Mathew Schmidt, Goleta, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 512 days.

This patent is subject to a terminal disclaimer.

(21) Appl. No.: 12/942,817

(22) Filed: Nov. 9, 2010

(65) Prior Publication Data
US 2013/0234111 A1 Sep. 12, 2013

(51) Int. Cl.
| H01L 33/06 | (2010.01) |
| H01L 29/20 | (2006.01) |
| H01S 5/02 | (2006.01) |
| H01S 5/323 | (2006.01) |
| H01S 5/00 | (2006.01) |
| H01S 5/042 | (2006.01) |
| H01S 5/32 | (2006.01) |
| H01S 5/20 | (2006.01) |

(52) U.S. Cl.
CPC .............. *H01L 29/20* (2013.01); *H01S 5/0014* (2013.01); *H01S 5/0202* (2013.01); *H01S 5/0421* (2013.01); *H01S 5/3202* (2013.01); *H01S 5/32341* (2013.01); *H01S 5/2013* (2013.01)

(58) Field of Classification Search
CPC ...... H01S 5/0217; H01S 5/0425; H01S 5/028
USPC .............................. 257/12–14, 79–103, 918, 257/E51.018–E51.022, E33.001–E33.077, 257/E33.054, E25.028, E25.032; 438/22, 438/29, 34, 42
See application file for complete search history.

(56) References Cited

U.S. PATENT DOCUMENTS

| 4,318,058 A | 3/1982 | Mito et al. |
| 4,341,592 A | 7/1982 | Shortes et al. |
| 4,860,687 A | 8/1989 | Frijlink |
| 4,911,102 A | 3/1990 | Manabe et al. |

(Continued)

FOREIGN PATENT DOCUMENTS

| CN | 101009347 | 3/1987 |
| CN | 1538534 | 10/2004 |

(Continued)

OTHER PUBLICATIONS

U.S. Appl. No. 12/497,289, unpublished, filed Jul. 2, 2009, Raring et al.

(Continued)

*Primary Examiner* — Wael Fahmy
*Assistant Examiner* — Sue Tang
(74) *Attorney, Agent, or Firm* — Kilpatrick Townsend & Stockton LLP

(57) ABSTRACT

A method for forming optical devices. The method includes providing a gallium nitride substrate member having a crystalline surface region and a backside region. The method also includes subjecting the backside region to a laser scribing process to form a plurality of scribe regions on the backside region and forming a metallization material overlying the backside region including the plurality of scribe regions. The method removes at least one optical device using at least one of the scribe regions.

24 Claims, 15 Drawing Sheets

(56) References Cited

U.S. PATENT DOCUMENTS

| | | |
|---|---|---|
| 4,915,745 A | 4/1990 | Pollock et al. |
| 5,331,654 A | 7/1994 | Jewell et al. |
| 5,334,277 A | 8/1994 | Nakamura |
| 5,527,417 A | 6/1996 | Lida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,696,389 A | 12/1997 | Ishikawa et al. |
| 5,821,555 A | 10/1998 | Saito et al. |
| 5,888,907 A | 3/1999 | Tomoyasu et al. |
| 5,951,923 A | 9/1999 | Horie et al. |
| 6,069,394 A | 5/2000 | Hashimoto et al. |
| 6,072,197 A * | 6/2000 | Horino et al. ............... 257/103 |
| 6,147,953 A | 11/2000 | Duncan |
| 6,153,010 A | 11/2000 | Kiyoku et al. |
| 6,195,381 B1 | 2/2001 | Botez et al. |
| 6,303,405 B1 * | 10/2001 | Yoshida et al. ............... 438/46 |
| 6,379,985 B1 | 4/2002 | Cervantes et al. |
| 6,451,157 B1 | 9/2002 | Hubacek |
| 6,631,150 B1 * | 10/2003 | Najda ................... 372/45.01 |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,350,273 B2 | 1/2013 | Vielemeyer |
| 8,351,478 B2 | 1/2013 | Raring et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,451,876 B1 | 5/2013 | Raring et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0113141 A1 * | 6/2004 | Isuda et al. ..................... 257/13 |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0233950 A1 | 11/2004 | Furukawa et al. |
| 2004/0247275 A1 | 12/2004 | Vakhshoori et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 * | 10/2005 | Huang ........................ 257/103 |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0033009 A1 | 2/2006 | Kobayashi et al. |
| 2006/0037529 A1 | 2/2006 | D'Evelyn |
| 2006/0060131 A1 | 3/2006 | Atanackovic |
| 2006/0077795 A1 * | 4/2006 | Kitahara et al. .......... 369/44.24 |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0029152 A1 | 2/2008 | Milshtein et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |

(56) References Cited

U.S. PATENT DOCUMENTS

| | | |
|---|---|---|
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191223 A1 | 8/2008 | Nakamura et al. |
| 2008/0198881 A1 | 8/2008 | Farrell et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0028204 A1 | 1/2009 | Hiroyama et al. |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0095973 A1* | 4/2009 | Tanaka et al. .............. 257/99 |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0170224 A1* | 7/2009 | Urashima .............. 438/22 |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0276663 A1* | 11/2010 | Enya et al. .............. 257/13 |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1* | 2/2011 | Hamaguchi et al. ........ 257/79 |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |

FOREIGN PATENT DOCUMENTS

| | | |
|---|---|---|
| CN | 1702836 | 11/2005 |
| CN | 101079463 | 11/2007 |
| CN | 101099245 | 1/2008 |
| CN | 101171692 | 4/2008 |
| JP | 3-287770 | 12/1991 |
| JP | 09-036430 | 2/1997 |
| JP | 2000-294883 | 10/2000 |
| JP | 2001-160627 | 6/2001 |
| JP | 2002-185085 | 6/2002 |
| JP | 2006-173621 | 6/2006 |
| JP | 2007-173467 A | 7/2007 |
| JP | 2007-068398 | 4/2008 |
| JP | 2008-311640 | 12/2008 |
| WO | WO2008-041521 | 4/2008 |
| WO | WO 2010/120819 | 10/2010 |
| WO | WO 2010/138923 | 12/2010 |

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993," IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Fujii et al., "Increase in the Extraction Efficiency of GaN-based Light-Emitting Diodes Via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Gardner et al. "Blue-emitting InGaN-GaN double-heterostructure light-emitting diodes reaching maximum quantum efficiency above 200 A/ cm2", Applied Physics Letters 91, 243506 (2007).

hap ://techon.nikkeibp. co jp/english/NEWS_EN/20080122/146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

(56) References Cited

OTHER PUBLICATIONS

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al " Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.
Purvis, "Changing the Crystal Face of Gallium Nitride." The Advance Semiconductor Magazine, vol. 18, No. 8, Nov. 2005.
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Shchekin et al., "High Performance Thin-film Flip-Chip InGaN-GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et. al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Uchida et al.,"Recent Progress in High-Power Blue-violet Lasers," 2003, IEEE Journal of Selected Topics in Quantum Electronics; vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
Chinese Office Action From Chinese Patent Application No. 200980134723.8 dated Nov. 1, 2012, 22 pgs. (With Translation).
Franssila, 'Tools for CVD and Epitaxy', Introduction to Microfabrication, 2004, pp. 329-336.
USPTO Office Action for U.S. Appl. No. 12/789,303 dated Sep. 24, 2012.
USPTO Office Action for U.S. Appl. No. 12/859,153 dated Sep. 25, 2012.
USPTO Notice of Allowance for U.S. Appl. No. 12/883,093 dated Nov. 21, 2012.
USPTO Notice of Allowance for U.S. Appl. No. 12/884,993 dated Nov. 26, 2012.
USPTO Office Action for U.S. Appl. No. 13/354,639 dated Nov. 7, 2012.
USPTO Notice of Allowance for U.S. Appl. No. 13/354,639 dated Dec. 14, 2012.
Founta et al., 'Anisotropic Morphology of Nonpolar a-Plane GaN Quantum Dots and Quantum Wells,' Journal of Applied Physics, vol. 102, 2007, pp. 074304-1-074304-6.
USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/484,924 dated Apr. 14, 2011.
USPTO Office Action for U.S. Appl. No. 12/491,169 dated Oct. 22, 2010.
USPTO Office Action for U.S. Appl. No. 12/491,169 dated May 11, 2011.
USPTO Notice of Allowance for U.S. Appl. No. 12/497,289 dated May 22, 2012.
USPTO Office Action for U.S. Appl. No. 12/502,058 dated Dec. 8, 2010.
USPTO Office Action for U.S. Appl. No. 12/502,058 dated Aug. 19, 2011.
USPTO Notice of Allowance for U.S. Appl. No. 12/502,058 dated Apr. 16, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,476 dated Apr. 11, 2011.
USPTO Office Action for U.S. Appl. No. 12/749,476 dated Nov. 8, 2011.

(56) References Cited

OTHER PUBLICATIONS

USPTO Notice of Allowance for U.S. Appl. No. 12/749,476 dated May 4, 2012.
USPTO Notice of Allowance for U.S. Appl. No. 12/762,269 dated Apr. 23, 2012.
USPTO Office Action for U.S. Appl. No. 12/762,271 dated Jun. 6, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Office Action for U.S. Appl. No. 12/883,093 dated Mar. 13, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Apr. 13, 2012.
USPTO Notice of Allowance for U.S. Appl. No. 12/502,058 dated Jul. 19, 2012.
USPTO Office Action for U.S. Appl. No. 12/749,466 dated Jul. 3, 2012.
USPTO Notice of Allowance for U.S. Appl. No. 12/749,476 dated Jun. 26, 2012.
USPTO Office Action for U.S. Appl. No. 12/759,273 dated Jun. 26, 2012.
USPTO Notice of Allowance for U.S. Appl. No. 12/762,271 dated Aug. 8, 2012.
USPTO Notice of Allowance for U.S. Appl. No. 12/880,803 dated Jul. 18, 2012.
USPTO Office Action for U.S. Appl. No. 12/883,093 dated Aug. 3, 2012.
USPTO Office Action for U.S. Appl. No. 12/884,993 dated Aug. 2, 2012.
USPTO Office Action for U.S. Appl. No. 12/995,946 dated Mar. 28, 2012.
USPTO Office Action for U.S. Appl. No. 13/046,565 dated Jul. 19, 2012.
Office action for U.S. Appl. No. 12/873,820 (Oct. 11, 2012).
Office action for U.S. Appl. No. 12/749,466 (Feb. 3, 2012).
Office action for U.S. Appl. No. 13/046,565 (Feb. 2, 2012).
Office action for U.S. Appl. No. 13/046,565 (Nov. 7, 2011).
Office action for U.S. Appl. No. 12/484,924 (Oct. 31, 2011).
Office action for U.S. Appl. No. 12/497,289 (Feb. 2, 2012).
Office action for U.S. Appl. No. 12/759,273 (Nov. 21, 2011).
Office action for U..S Appl. No. 12/762,269 (Oct. 12, 2011).
Office action for U.S. Appl. No. 12/762,271 (Dec. 23, 2011).
Office action for U.S. Appl. No. 12/778,718 (Nov. 25, 2011).
Notice of Allowance for U.S. Appl. No. 12/762,278 (Nov. 7, 2011).
Abare "Cleaved and Etched Facet Nitride Laser Diodes," IEEE Journal of Selected Topics in Quantum Electronics, vol. 4, No. 3, pp. 505-509 (May 1998).
Asif Khan "Cleaved cavity optically pumped InGaN-GaN laser grown on spinel substrates," Appl. Phys. Lett. 69 (16), pp. 2418-2420 (Oct. 14, 1996).
Lin et al."Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Okamoto et al. In "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Park, "Crystal orientation effects on electronic properties of wurtzite InGaN/GaN quantum wells,",Journal of Applied Physics vol. 91, No. 12, pp. 9904-9908 (Jun. 2002).
Romanov "Strain-induced polarization in wurtzite III-nitride semipolar layers," Journal of Applied Physics 100, pp. 023522-1 through 023522-10 (Jul. 25,2006).
Schoedl "Facet degradation of GaN heterostructure laser diodes," Journal of Applied Physics vol. 97, issue 12, pp. 123102-1 to 123102-8 (2005).
Enya et al., '531nm Green Lasing of InGaN Based Laser Diodes on Semi-Polar {20-21} Free-Standing GaN Substrates', Applied Physics Express, Jul. 17, 2009, vol. 2, pp. 082101.
Communication from the German Patent Office re 11 2010 003 697.7 dated Apr. 11, 2013, 6 pages.
Communication from the Japanese Patent Office re 2012-529905 dated Apr. 19, 2013, 4 pages.
Yoshizumi et al., 'Continuous-Wave Operation of 520nm Green InGaN-Based Laser Diodes on Semi- Polar {2021} GaN Substrates', Applied Physics Express, vol. 2, 2009, pp. 092101-1-092101-3.
USPTO Office Action for U.S. Appl. No. 12/883,652 dated Jan. 11, 2013, 12 pages.
USPTO Office Action for U.S. Appl. No. 13/425,354 dated Aug. 2, 2013, 16 pages.
Adesida et al., 'Characteristics of chemically assisted ion beam etching of gallium nitride', Applied Physics Letters, vol. 65, No. 7, 1994, pp. 889-891.
Behfar et al., 'Progress in Etched Facet Technology for GaN and Blue Lasers', Proc. of SPIE., vol. 6473, 64731F, 2007, pp. 1-8.
International Preliminary Report & Written Opinion of PCT Application No. PCT/US2011/060030 dated Mar. 21, 2012, 11 pgs. total.
USPTO Notice of Allowance for U.S. Appl. No. 12/749,466 dated Jan. 2, 2013.
USPTO Office Action for U.S. Appl. No. 12/787,343 dated Dec. 17, 2012.
USPTO Notice of Allowance for U.S. Appl. No. 12/787,343 dated Jun. 10, 2013.
USPTO Notice of Allowance for U.S. Appl. No. 12/789,303 dated Dec. 21, 2012.
USPTO Office Action for U.S. Appl. No. 12/868,441 dated Dec. 18, 2012.
USPTO Office Action for U.S. Appl. No. 13/114,806 dated Apr. 12, 2013.
USPTO Office Action for U.S. Appl. No. 13/291,922 dated Jun. 18, 2013.
USPTO Office Action for U.S. Appl. No. 13/548,635 dated Jun. 14, 2013.
USPTO Notice of Allowance for U.S. Appl. No. 13/606,894 dated May 24, 2013.
International Preliminary Report & Written Opinion of PCT Application No. PCT/US2011/037792, dated Sep. 8, 2011, 13 pages total.
Tyagi et al., 'Semipolar (1011) InGaN/GaN Laser Diodes on Bulk GaN Substrates,' Japanese Journal of Applied Physics, vol. 46, No. 19, 2007, pp. L444-L445.
USPTO Office Action for U.S. Appl. No. 12/995,946 dated Jan. 29, 2013.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/859,153 dated Feb. 26, 2013.
USPTO Notice of Allowance for U.S. Appl. No. 13/108,645 dated Jan. 28, 2013.
USPTO Office Action for U.S. Appl. No. 13/291,922 dated Feb. 20, 2013.

(56) References Cited

OTHER PUBLICATIONS

USPTO Office Action for U.S. Appl. No. 13/425,354 dated Feb. 14, 2013.
USPTO Office Action for U.S. Appl. No. 13/548,312 dated Mar. 12, 2013.
USPTO Office Action for U.S. Appl. No. 13/606,894 dated Feb. 5, 2013.
Non-Final Office Action of Dec. 20, 2013 for U.S. Appl. No. 13/291,922, 12 pages.
Final Office Action of Jun. 19, 2014 for U.S. Appl. No. 13/291,922 14 pages.
Notice of Allowance of Nov. 7, 2014 for U.S. Appl. No. 13/291,922, 9 pages.

* cited by examiner

Figure 1: c-direction laser diode on nonpolar substrate with cleaved mirror

Figure 3: Mirrors/Polarization/Gain
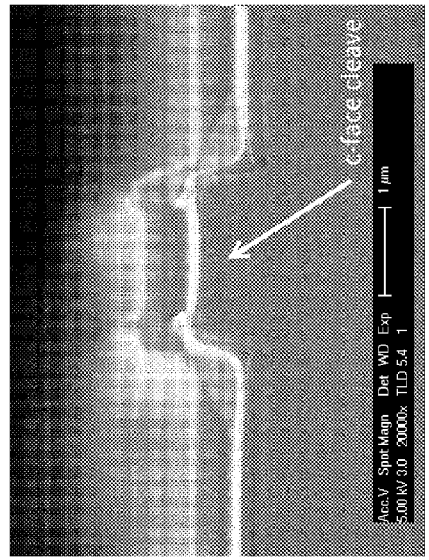
- c-direction cleaved facets
  - Smooth and vertical = great mirror
- Must orient lasers in c-direction
  - For max gain, light polarization must be perp. to laser stripe
- Off-axis orientations to increase polarization/gain
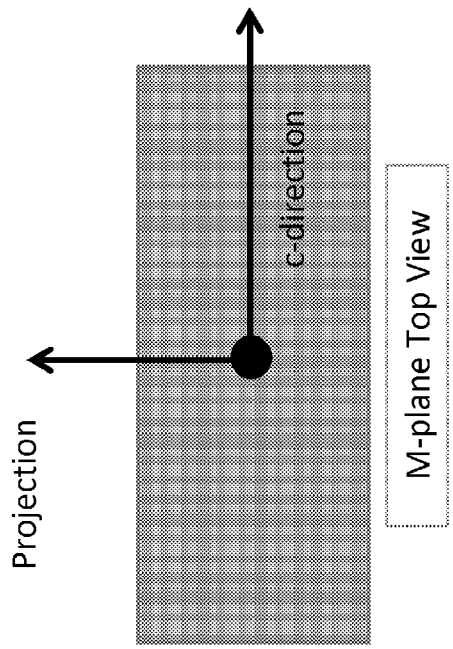
Figure 4

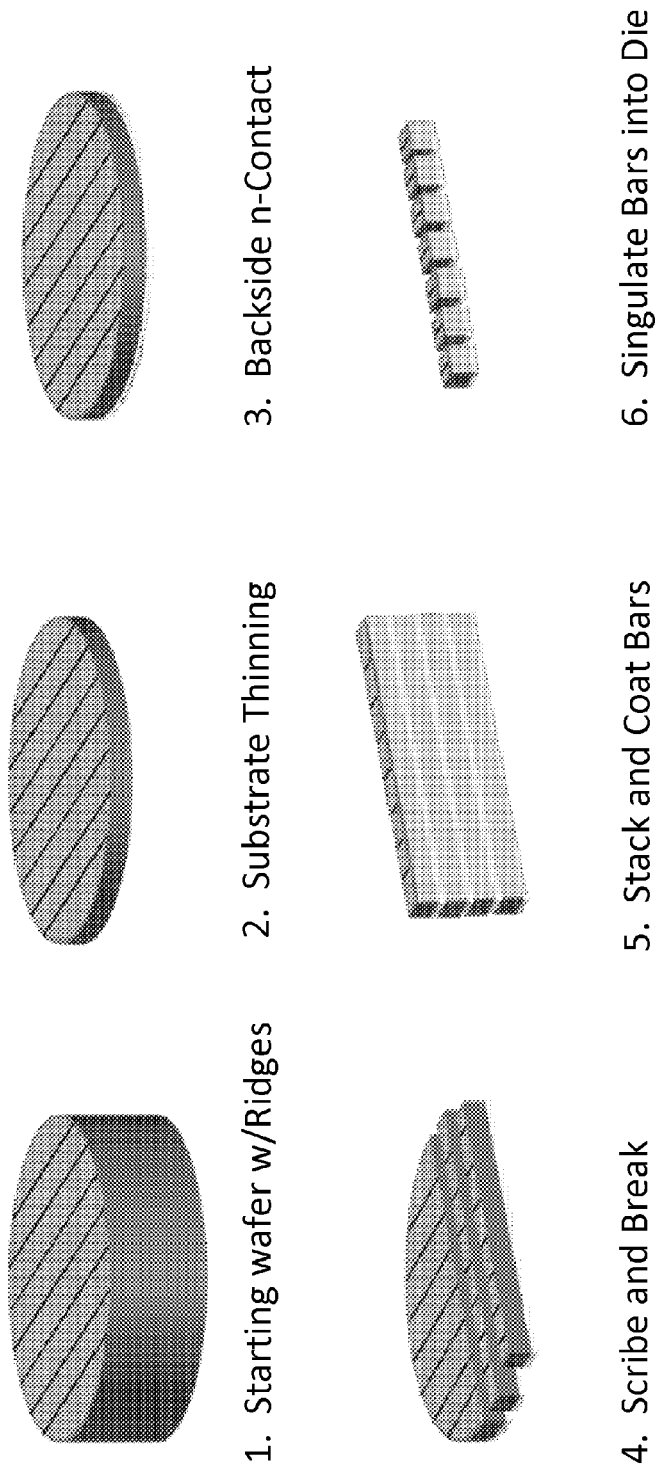
Figure 5: Backend Process Flow

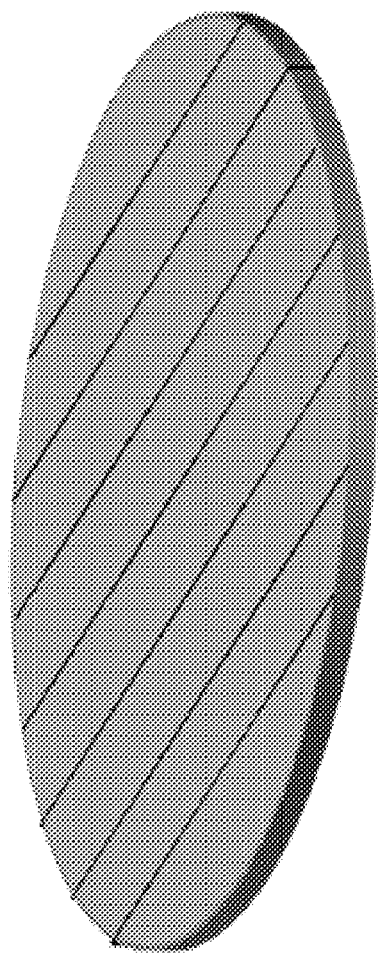
Figure 6: Substrate Thinning

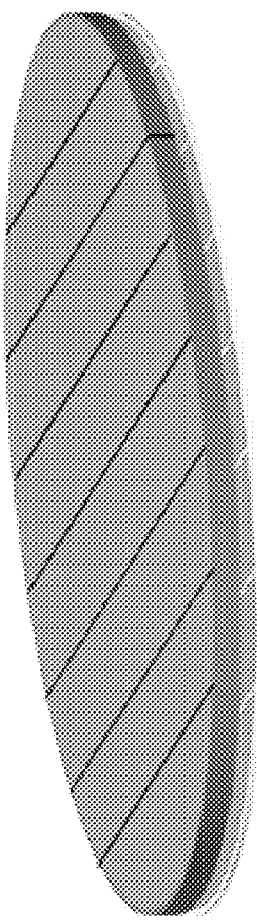
Figure 7: Backside n-Contact

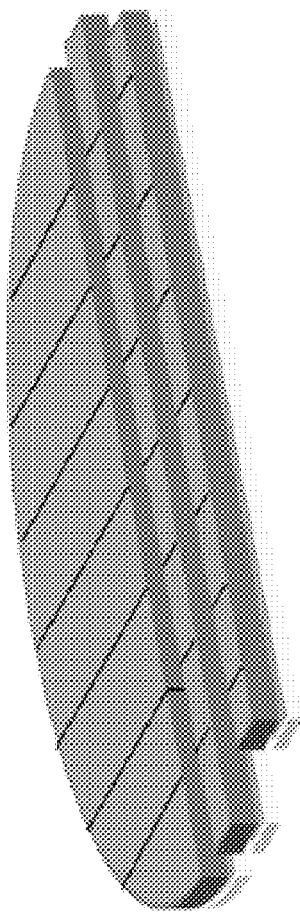
Figure 8: Scribe and Break

Figure 9: Scribe and Break
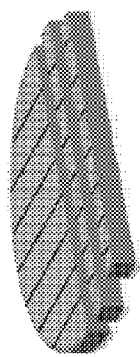

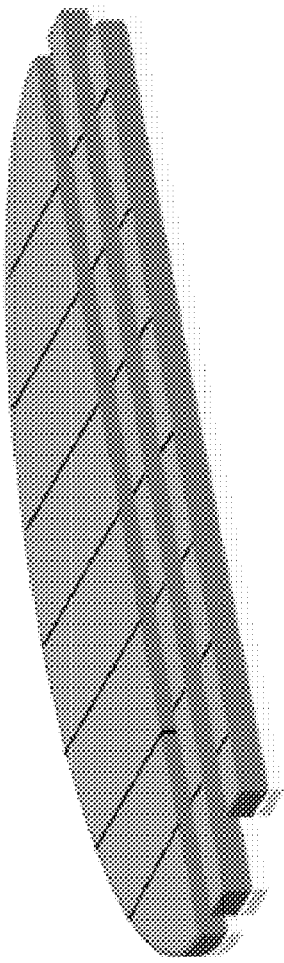
Figure 10: Scribe and Break

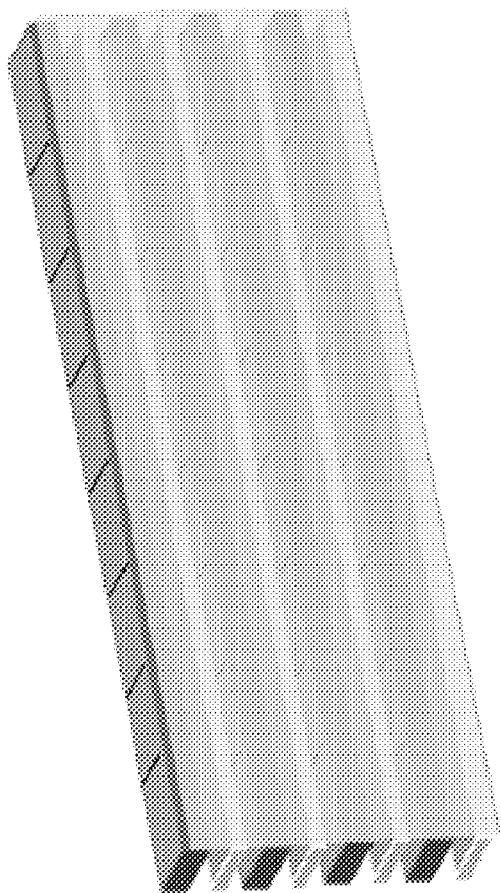
Figure 11: Stack and Coat Bars

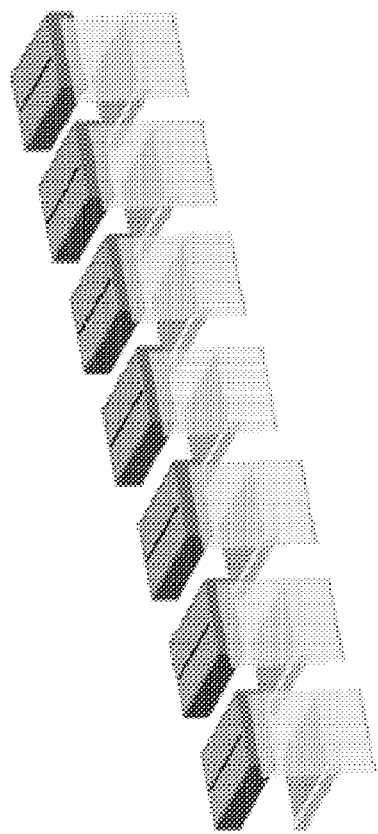
Figure 12: Singulate Bars into Die

Mount to Carrier

Lapping

Polish

Laser Scribe

HCl and HF dip

N-Contact Deposition

Figure 19: TLM Voltage versus Current Data
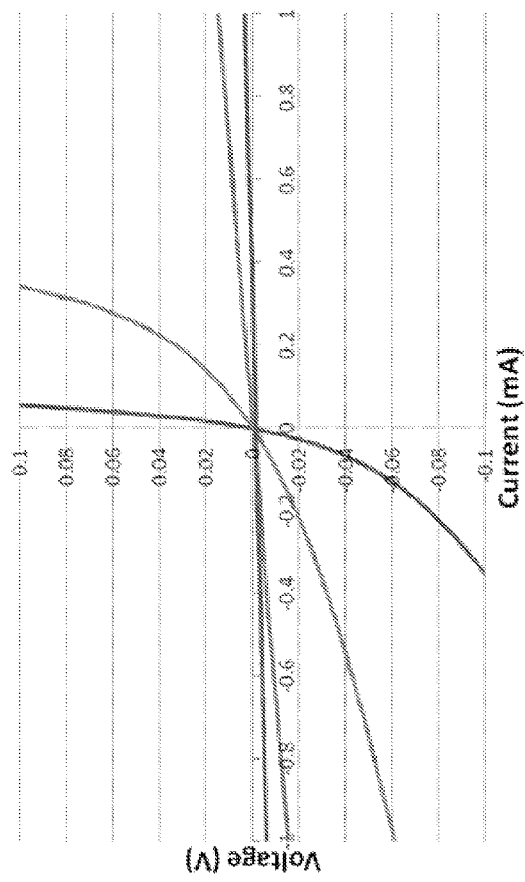

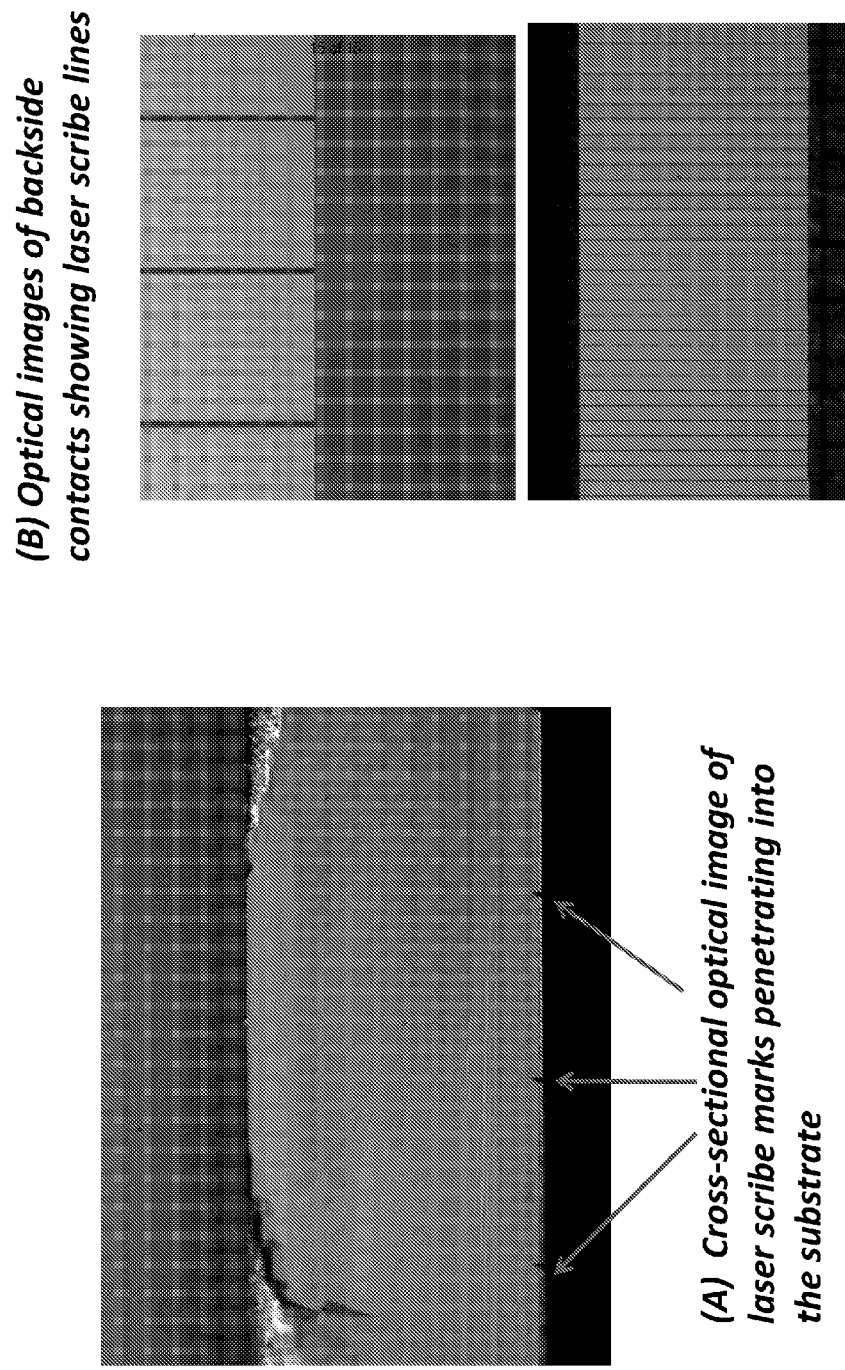
Figure 20: Images of Laser Scribe Contacting Method

METHOD OF FABRICATING OPTICAL DEVICES USING LASER TREATMENT

BACKGROUND OF THE INVENTION

The present invention is directed to optical devices and related methods. More particularly, the present invention provides a method and device for emitting electromagnetic radiation using nonpolar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional Edison light bulb:

- The conventional light bulb dissipates much thermal energy. More than 90% of the energy used for the conventional light bulb dissipates as thermal energy.
- Reliability is an issue since the conventional light bulb routinely fails often due to thermal expansion and contraction of the filament element.
- Light bulbs emit light over a broad spectrum, much of which does not result in bright illumination or due to the spectral sensitivity of the human eye.
- Light bulbs emit in all directions and are not ideal for applications requiring strong directionality or focus such as projection displays, optical data storage, or specialized directed lighting.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the efficiency, size, weight, and cost of the lasers were undesirable.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state lasers had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the efficiency of the LPSS lasers, and further commercialization ensue into more high end specialty industrial, medical, and scientific applications. However, the change to diode pumping increased the system cost and required precised temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging. Additionally, while the diode-SHG lasers have the benefit of being directly modulate-able, they suffer from severe sensitivity to temperature which limits their application.

From the above, it is seen that techniques for improving optical devices is highly desired.

BRIEF SUMMARY OF THE INVENTION

According to the present invention, techniques related generally to optical devices are provided. More particularly, the present invention provides a method and device for emitting electromagnetic radiation using nonpolar gallium containing substrates such as GaN, MN, InN, InGaN, AlGaN, and AlInGaN, and others. In a specific embodiment, the electromagnetic radiation has a wavelength of 395, 405, 450, 485, 500, 520, nanometers and others. Merely by way of example, the invention can be applied to optical devices, lasers, light emitting diodes, solar cells, photoelectrochemical water splitting and hydrogen generation, photodetectors, integrated circuits, and transistors, among other devices.

In a specific embodiment, the present invention provides an optical device, e.g., laser, LED. The device comprises a gallium nitride substrate member having a crystalline surface region and a backside region. In a preferred embodiment, the surface region is configured as a non-polar or semipolar orientation, but can be others. The device has at least one scribe line configured from at least a laser process formed within a spatial region of the backside region. A metallization material IS overlying the backside region and one or more portions of the scribe line according to one or more embodiments.

In a specific embodiment, the present invention provides a method for forming optical devices. The method includes providing a gallium nitride substrate member having a crystalline surface region and a backside region. The method also includes subjecting the backside region to a laser scribing process to form a plurality of scribe regions on the backside region and forming a metallization material overlying the backside region including the plurality of scribe regions. The method removes at least one optical device using at least one of the scribe regions. In a specific embodiment, the scribe process is followed by a break process to remove and separate the optical device from a remaining portion of the substrate member. In an alternative embodiment, the laser scribing process may be performed after forming metallization material overlying the backside region.

In an alternative specific embodiment, the present invention provides a method for forming optical devices, e.g., lasers, LEDs. The method includes providing a gallium nitride substrate member having a crystalline surface region and a backside region in a specific embodiment. The crystalline surface region configured in a non-polar or semi-polar orientation or others. The method also includes forming one or more active regions configured to emit electromagnetic radiation for an optical device. The method forms a metallization material overlying a surface region, e.g., backside, frontside, edges, combinations. The method includes subjecting the surface region to a laser treatment process to change an operating voltage of the optical device from a first value to a second value, which is less than the first value by at least 10 percent, but can be other values. The method causes formation of at least one scribe region on the surface region. The method includes removing at least the optical device using at least the scribe region.

Benefits are achieved over pre-existing techniques using the present invention. In particular, the present invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a nonpolar gallium nitride material capable of achieve a laser having a wavelength of about 400 nanometers and 405 nanometers can greater, among others. In other embodiments, the device and method can achieve a wavelength of about 500 nanometers and greater including 520 nanometers. In a preferred embodiment, the resulting laser or light emitting diode device has an improved contact, which is lower in resistance and provides a lower voltage drop through the device. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings. That is, the description has been provided in terms of an optical device, but other devices can also be used. Such other devices include electrical devices, mechanical devices, and any combinations. Of course, there can be other variations, modifications, and alternatives.

BRIEF DESCRIPTION OF THE DRAWINGS

FIG. 3 is a cross-sectional view photograph of an c-direction cleaved facet for a laser device according to an embodiment of the present invention;

FIG. 4 is a top-view diagram of a laser device according to an embodiment of the present invention;

FIGS. 5 to 12 illustrate a simplified backend processing method of a laser device according to one or more embodiments of the present invention;

FIGS. 19 and 20 are simplified diagram illustrating experimental results of a laser scribing process for contact formation according to one or more examples of the present invention.

DETAILED DESCRIPTION OF THE INVENTION

According to the present invention, techniques related generally to optical devices are provided. More particularly, the present invention provides a method and device for emitting electromagnetic radiation using non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

Figure 1:
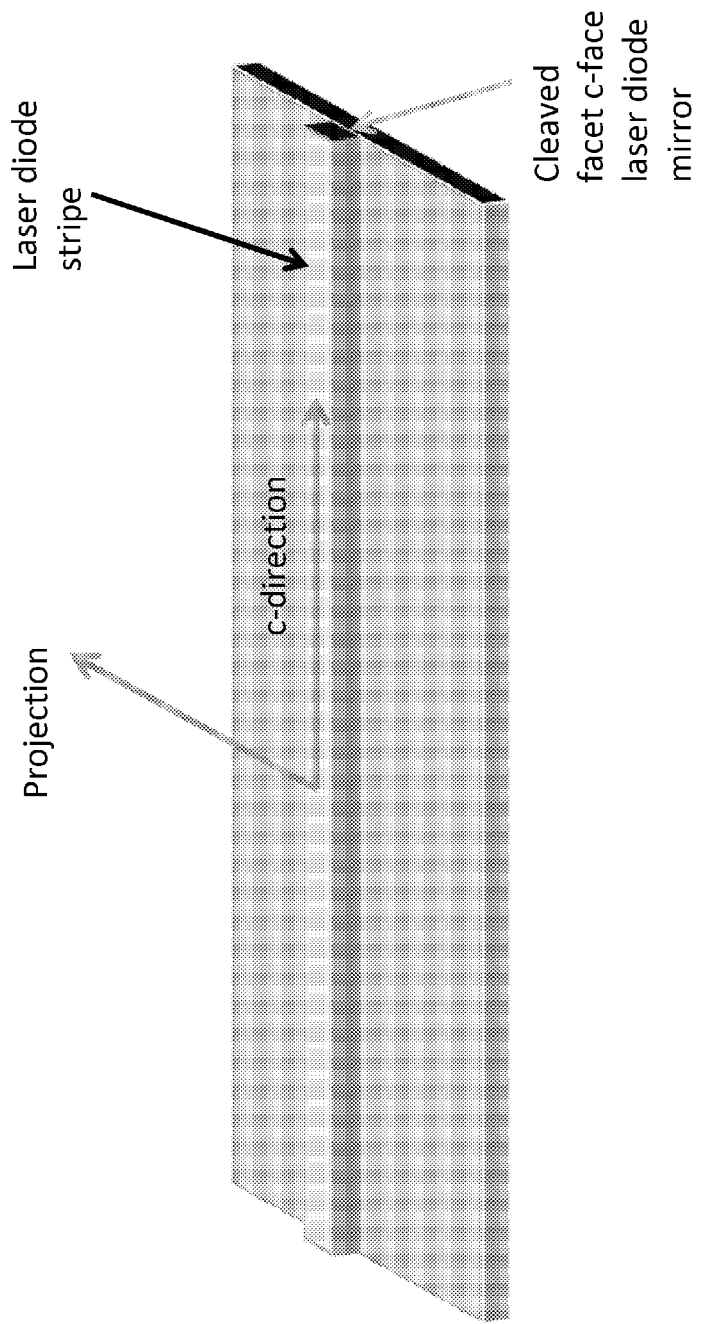
FIG. 1 is a simplified perspective view of a laser device fabricated on a nonpolar substrate according to an embodiment of the present invention.

FIG. 1 is a simplified perspective view of a laser device 100 fabricated on a non-polar substrate according to an embodiment of the present invention. This diagram is merely an example, which should not unduly limit the scope of the claims herein. One of ordinary skill in the art would recognize other variations, modifications, and alternatives. As shown, the optical device includes a gallium nitride substrate member 101 having a nonpolar crystalline surface region characterized by an orientation of about −6 degrees to about 6 degrees towards (000-1) and less than about 0.5 degrees towards (11-20). In a specific embodiment, the gallium nitride substrate member is a bulk GaN substrate characterized by having a nonpolar crystalline surface region, but can be others. In a specific embodiment, the bulk nitride GaN substrate comprises nitrogen and has a surface dislocation density below $10^5$ $cm^{-2}$. The nitride crystal or wafer may comprise $Al_xIn_yGa_{1-x-y}N$, where $0 \le x$, y, $x+y \le 1$. In one specific embodiment, the nitride crystal comprises GaN. In one or more embodiments, the GaN substrate has threading dislocations, at a concentration between about $10^5$ $cm^{-2}$ and about $10^8$ $cm^{-2}$, in a direction that is substantially orthogonal or oblique with respect to the surface. As a consequence of the orthogonal or oblique orientation of the dislocations, the surface dislocation density is below about $10^5$ $cm^{-2}$.

In a specific embodiment, the device has a laser stripe region formed overlying a portion of the nonpolar crystalline orientation surface region. In a specific embodiment, the laser stripe region is characterized by a cavity orientation is substantially parallel to the c-direction. In a specific embodiment, the laser strip region has a first end 107 and a second end 109.

In a preferred embodiment, the device has a first cleaved c-face facet provided on the first end of the laser stripe region and a second cleaved c-face facet provided on the second end of the laser stripe region. In one or more embodiments, the first cleaved c-facet is substantially parallel with the second cleaved c-facet. Mirror surfaces are formed on each of the cleaved surfaces. The first cleaved c-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titaniatantalum pentoxidezirconia, including combinations, and the like. Depending upon the embodiment, the first mirror surface can also comprise an anti-reflective coating. Of course, there can be other variations, modifications, and alternatives.

Also in a preferred embodiment, the second cleaved c-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, titania, tantalum, pentoxide, zirconia, combinations, and the like. In a specific embodiment, the second mirror surface comprises an anti-reflective coating. Of course, there can be other variations, modifications, and alternatives.

In a specific embodiment, the laser stripe has a length and width. The length ranges from about 50 microns to about 3000 microns. The strip also has a width ranging from about 0.5 microns to about 50 microns, but can be other dimensions. In a specific embodiment, the width is substantially constant in dimension, although there may be slight variations. The width and length are often formed using a masking and etching process, which are commonly used in the art. Further details of the present device can be found throughout the present specification and more particularly below.

In a specific embodiment, the device is also characterized by a spontaneously emitted light is polarized in substantially perpendicular to the c-direction. That is, the device performs as a laser or the like. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 405 nanometers to yield a blue emission, a green emission, and others. In a preferred embodiment, the spontaneously emitted light is highly polarized and is characterized by a polarization ratio of greater than 0.4. Of course, there can be other variations, modifications, and alternatives. Further details of the laser device can be found throughout the present specification and more particularly below.

Figure 2:
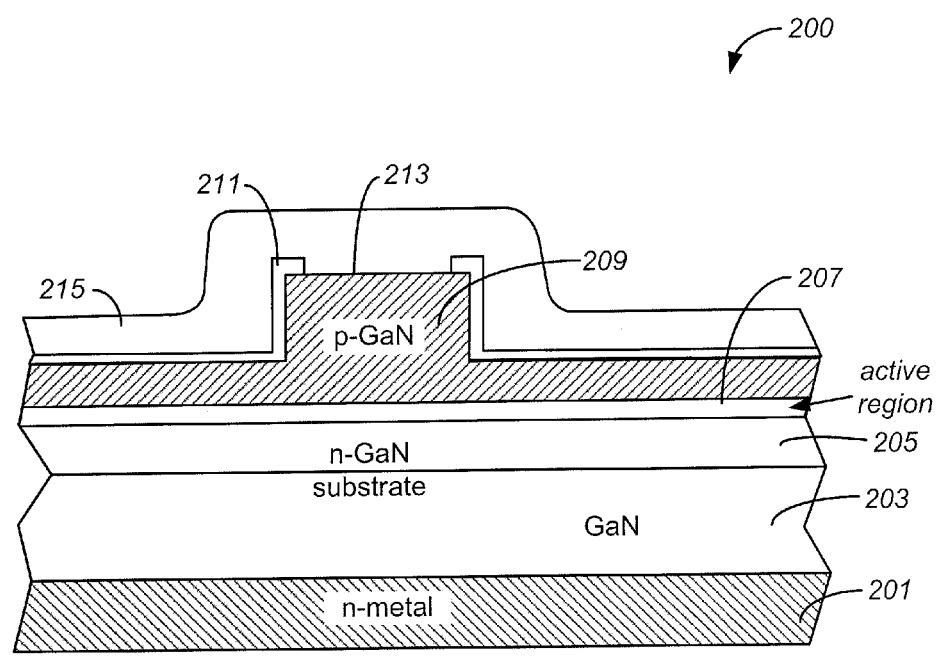
FIG. 2 is a detailed cross-sectional view of a laser device fabricated on a nonpolar substrate according to an embodiment of the present invention.
Figure 13:
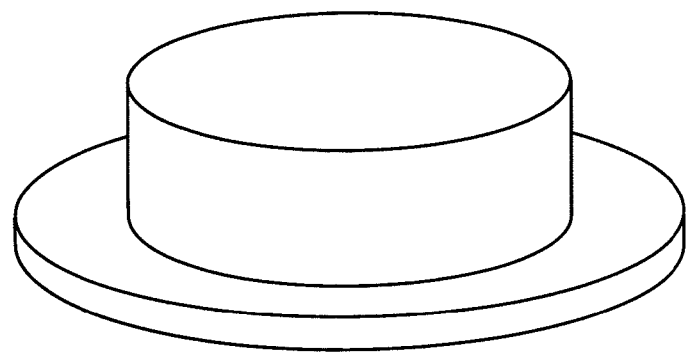
FIGS. 13 to 18 illustrate a simplified laser scribe process for improving contact regions of an optical device according to one or more embodiments of the present invention.
Figure 14:
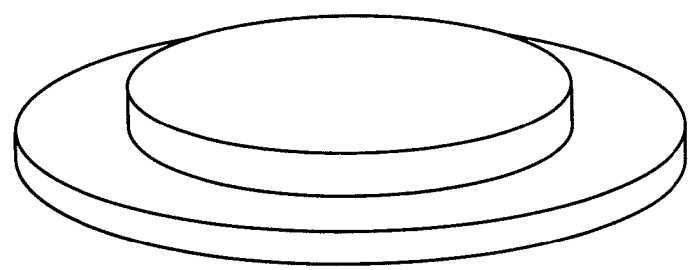
Figure 15:
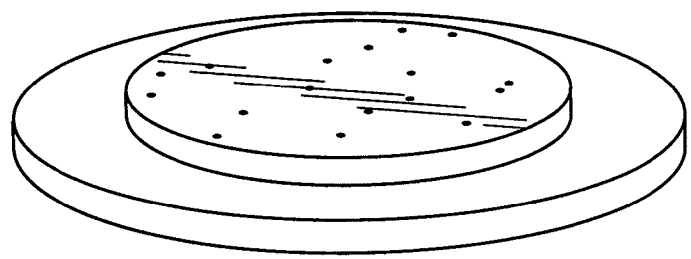
Figure 16:
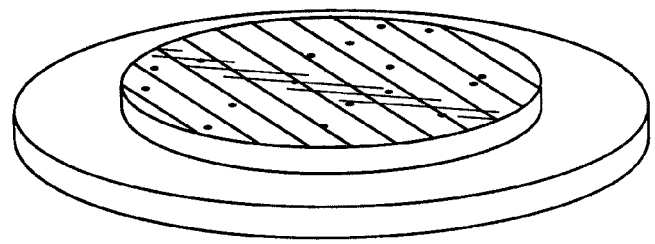
Figure 17:
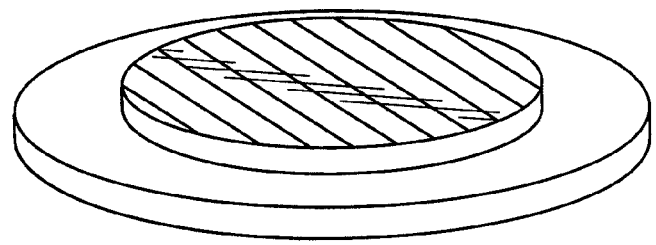
Figure 18:
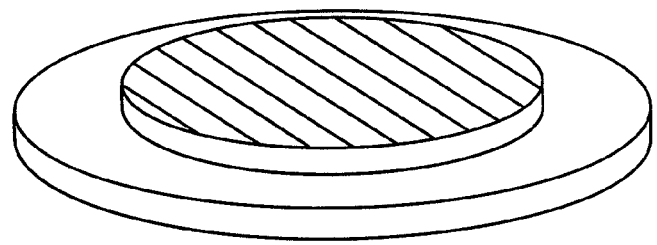

FIG. 2 is a detailed cross-sectional view of a laser device 200 fabricated on a nonpolar substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific embodiment, the metal back contact region is made of a suitable material such as those noted below and others. Further details of the contact region can be found throughout the present specification and more particularly below.

In a specific embodiment, the device also has an overlying n-type gallium nitride layer 205, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u$, v, $u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm is initiated.

In a specific embodiment, the laser stripe region is made of the p-type gallium nitride layer 209. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride, but can be others. The contact region is coupled to an overlying metal layer 215. The overlying metal layer is a multilayered structure containing gold and platinum (Pt/Au), but can be others. Of course, there can be other variations, modifications, and alternatives.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w$, x, y, z, $w+x$, $y+z \leq 1$, where $w<u$, y and/or $x>v$, z so that the bandgap of the well layer(s) is less than that of the barrier layer(s) and the n-type layer. The well layers and barrier layers may each have a thickness between about 1 nm and about 40 nm. In another embodiment, the active layer comprises a double heterostructure, with an InGaN or $Al_uIn_xGa_{1-w-x}N$ layer about 10 nm to 100 nm thick surrounded by GaN or $Al_yIn_zGa_{1-y-z}N$ layers, where $w<u$, y and/or $x>v$, z.

The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s$, t, $s+t \leq 1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. Of course, there can be other variations, modifications, and alternatives.

As noted, the p-type gallium nitride structure, which can be a p-type doped $AlqInrGa_{1-q-r}N$, where $0 \leq q$, r, $q+r \leq 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide, but can be others. Of course, there can be other variations, modifications, and alternatives.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. Of course, there can be other variations, modifications, and alternatives. Further details of the cleaved facets can be found throughout the present specification and more particularly below.

FIG. 3 is a cross-sectional view photograph of a c-direction cleaved facet for a laser device according to an embodiment of the present invention. This diagram is merely an example, which should not unduly limit the scope of the claims herein. One of ordinary skill in the art would recognize other variations, modifications, and alternatives. As shown, the c-direction cleaved facet is smooth and provides a suitable mirror surface. Details of the top-view of the laser device are provided below.

FIG. 4 is a top-view diagram of a laser device according to an embodiment of the present invention. This diagram is merely an example, which should not unduly limit the scope of the claims herein. One of ordinary skill in the art would recognize other variations, modifications, and alternatives. As shown, the laser stripe is configured in the c-direction, which has a projection normal to the c-direction. As shown, the top-view of the gallium nitride substrate is of a slight mis-cut or off-cut surface region orientation according to a specific embodiment.

A method of processing a laser device according to one or more embodiments may be outline as follows, see also FIG. 5:
1. Start;
2. Provide processed substrate including laser devices with ridges;
3. Thin substrate from backside;
4. Form backside n-contact;
5. Scribe pattern for separation of the laser devices configured in bar structures;
6. Break scribed pattern to form a plurality of bar structures;
7. Stack bar structures;
8. Coat bars structures;
9. Singulate bar structures into individual dies having laser device; and
10. Perform other steps as desired.

The above sequence of steps is used to form individual laser devices on a die from a substrate structure according to one or more embodiments of the present invention. In one or more preferred embodiments, the method includes cleaved facets substantially parallel to each other and facing each other in a ridge laser device configured on a non-polar gallium nitride substrate material. Depending upon the embodiment, one or more of these steps can be combined, or removed, or other steps may be added without departing from the scope of the claims herein. One of ordinary skill in the art would recognize other variations, modifications, and alternatives. Further details of this method are provided throughout the present specification and more particularly below.

FIG. 6 is a simplified illustrating of a substrate thinning process according to an embodiment of the present invention. This diagram is merely an illustration and should not unduly limit the scope of the claims herein. One of ordinary skill in the art would recognize other variations, modifications, and alternatives. In a specific embodiment, the method begins with a gallium nitride substrate material including laser devices and preferably ridge laser devices, but can be others. The substrate has been subjected to frontside processing according to a specific embodiment. After frontside processing has been completed, one or more of the GaN substrates are mounted frontside down onto a sapphire carrier wafer or other suitable member. As an example, the method uses Crystalbond 509, which is a conventional mounting thermoplastic. The thermoplastic can be dissolved in acetone or other suitable solvent. Of course, there can be other variations, modifications, and alternatives.

In a specific embodiment, the carrier wafer is mounted to a lapping jig. An example of such lapping jig is made by Logitech Ltd. (Logitech) of the United Kingdom, or other vendor. The lapping jig helps maintain planarity of the substrates during the lapping process according to a specific embodiment. As an example, the starting thickness of the substrates are ~325 um+/−20 um, but can be others. In a specific embodiment, the method laps or thins the substrates down to 70-80 um thickness, but can also be thinner or slightly thicker. In a preferred embodiment, the lapping jig is configured with a lapping plate, which is often made of a suitable material such as cast iron configured with a flatness of less than 5 um, but can be others. Preferably, the method uses a lapping slurry that is 1 part silicon carbide (SiC) and 10 parts water, but can also be other variations. In a specific embodiment, the SiC grit is about Sum in dimension. In one or more embodiments, the lapping plate speed is suitable at about 10 revolutions per minute. Additionally, the method can adjust the lapping jig's down pressure to achieve a desired lapping rate, such as 2-3 um/min or greater or slightly less according to one or more embodiments.

In a specific embodiment, the present method includes a lapping process that may produce subsurface damage in the GaN material to cause generation of mid level traps or the like. The midlevel traps may lead to contacts having a Schottky characteristic. Accordingly, the present method includes one or more polishing processes such that ~10 um of material having the damage is removed according to a specific embodiment. As an example, the method uses a Politex™ polishing pad of Rohm and Haas, but can be others, that is glued onto a stainless steel plate. A polishing solution is Ultrasol 300K manufactured by Eminess Technologies, but can be others. The Ultra-Sol 300K is a high-purity colloidal silica slurry with a specially designed alkaline dispersion. It contains 70 nm colloidal silica and has a pH of 10.6, but can be others. The solids content is 30% (by weight). In a specific embodiment, the lapping plate speed is 70 rpm and the full weight of the lapping jig is applied. In a preferred embodiment, the method includes a polishing rate of about ~2 um/hour, but can be others. Of course, there can be other variations, modifications, and alternatives.

In other embodiments, the present invention provides a method for achieving high quality n-type contacts for m-plane GaN substrate material. In a specific embodiment, the method provides contacts that are rough to achieve suitable ohmic contact. In a specific embodiment, the roughness causes exposure of other crystal planes, which lead to good contacts. In another embodiment, the present method includes a lapped surface, which is rough in texture to expose more than one or multiple different crystal planes. In other embodiments, lapping may be followed by etching such as dry etching and/or wet etching. In a specific embodiment, etching removes the subsurface damage, however, it is likely not to planarize the surface like polishing. Of course, there can be other variations, modifications, and alternatives.

In a preferred embodiment the sample is subjected to a lapping step, a polishing step, and is then subjected to the laser scribe. Depending upon the embodiment, one or more steps can be added or removed or modified. Of course, there can be other variations, modifications, and alternatives.

FIG. 7 is a simplified diagram illustrating a backside n-contact method according to one or more embodiments. This diagram is merely an illustration and should not unduly limit the scope of the claims herein. One of ordinary skill in the art would recognize other variations, modifications, and alternatives. After the thinning process is complete, the method forms n-contacts on the backside of the substrates according to one or more embodiments. At this point, the thinned substrates are still mounted to and maintained on the sapphire wafer. In a preferred embodiment, the thinned substrates are "batch processed" for efficiency and handling. In a specific embodiment, the method using batch processing helps prevent any damage associated with handling very thin (e.g., 60-80 um) substrates.

As an example, the backside contact includes about 300 Å Al/3000 Å Au or other suitable materials. In a specific embodiment, the contact is a stack of metals that are deposited by e-beam evaporation or other suitable techniques. In a preferred embodiment and prior to the metal stack deposition, the method includes use of a wet etch such as an hydrofluoric acid wet etch to remove any oxides on the surface. In a specific embodiment, the metal stack is preferably not annealed or subjected to high temperature processing after its formation. Of course, there can be other variations, modifications, and alternatives.

FIG. 8 is a simplified diagram illustrating a scribe and break operation according to one or more embodiments. This diagram is merely an illustration and should not unduly limit the scope of the claims herein. One of ordinary skill in the art would recognize other variations, modifications, and alternatives. After the n-contact is formed, the substrates are demounted from the sapphire carrier wafer and cleaned in acetone and isopropyl alcohol according to a specific embodiment. The substrates are then mounted onto vinyl tape for the scribe and break process depending upon the embodiment. In a preferred embodiment, the tape does not leave any residue on the laser bars, which are substantially free from such residues, which are often polymeric in nature or particulates.

Next, the method includes one or more scribing processes. In a specific embodiment, the method includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (e.g., 355 nm) laser to scribe the laser bars. In a specific embodiment, the laser is configured on a system, which allows for accurate scribe lines configured in one or more different patterns and profiles. In one or more embodiments, the scribing can be performed on the backside, frontside, or both depending upon the application. Of course, there can be other variations, modifications, and alternatives.

In a specific embodiment, the method uses backside scribing or the like. With backside scribing, the method preferably forms a continuous line scribe that is perpendicular to the laser bars on the backside of the GaN substrate. In a specific embodiment, the scribe is generally 15-20 um deep or other suitable depth. Preferably, backside scribing can be advantageous. That is, the scribe process does not depend on the pitch of the laser bars or other like pattern. Accordingly, backside scribing can lead to a higher density of laser bars on each substrate according to a preferred embodiment. In a specific embodiment, backside scribing, however, may lead to residue from the tape on one or more of the facets. In a specific embodiment, backside scribe often requires that the substrates face down on the tape. With frontside scribing, the backside of the substrate is in contact with the tape. Of course, there can be other variations, modifications, and alternatives.

In a preferred embodiment, the present method uses frontside scribing, which facilitates formation of clean facets. In a specific embodiment, the frontside scribing process is preferably used. In a specific embodiment, the method includes a scribe pattern to produce straight cleaves with minimal facet roughness or other imperfections. Further details of scribing are provided below.

Scribe Pattern: The pitch of the laser mask is about 200 um, but can be others. The method uses a 170 um scribe with a 30 um dash for the 200 um pitch. In a preferred embodiment, the scribe length is maximized or increased while maintaining the heat affected zone of the laser away from the laser ridge, which is sensitive to heat.

Scribe Profile: A saw tooth profile generally produces minimal facet roughness. It is believed that the saw tooth profile shape creates a very high stress concentration in the material, which causes the cleave to propagate much easier and/or more efficiently.

In a specific embodiment, the present method provides for a scribe suitable for fabrication of the present laser devices. As an example, FIG. 9 illustrates cross-sections of substrate materials associated with (1) a backside scribe process; and (2) a frontside scribe process. Of course, there can be other variations, modifications, and alternatives.

Referring now to FIG. 10, the method includes a breaking process to form a plurality of bar structures. This diagram is merely an illustration and should not unduly limit the scope of the claims herein. One of ordinary skill in the art would recognize other variations, modifications, and alternatives. After the GaN substrates are scribed, the method uses a breaker to cleave the substrates into bars. In a specific embodiment, the breaker has a metal support that has a gap spacing of 900 um. The substrate is positioned over the support so that the scribe line is in the centered. A suitably sharp ceramic blade, then applies pressure directly on the scribe line causing the substrate to cleave along the scribe line.

FIG. 11 is a simplified diagram illustrating a stacking and coating process according to one or more embodiments. Again, this diagram is merely an illustration and should not unduly limit the scope of the claims herein. One of ordinary skill in the art would recognize other variations, modifications, and alternatives. After cleaving, the bars are stacked in a fixture that allows for coating the front facet and back facet, which are in parallel alignment with each other and facing each other. The front facet coating films can be selected from any suitable low reflectance design (AR design). The AR design includes a quarterwave coating of $Al_2O_3$ capped with a thin layer of $HfO_2$ according to a specific embodiment. The $Al_2O_3$ coating is a robust dielectric, and $HfO_2$ is dense, which helps environmentally passivate and tune the reflectance of the front facet. These coating films are preferably deposited by e beam evaporation. In a specific embodiment, the back facet is coated with a high reflectance HR design. The HR design includes several quarterwave pairs of $SiO_2/HfO_2$. In a specific embodiment, roughly 6-7 pairs may be used to achieve a reflectance over 99%. Of course, there can be other variations, modifications, and alternatives.

In a preferred embodiment, the method uses a suitable deposition system configured for deposition of each of the facets without breaking vacuum. The deposition system includes a dome structure with sufficient height and spatial volume. The system allows for the plurality of bars configured in a fixture to be flipped from one side to another side and to expose the back facet and the front facet according to a specific embodiment. In a preferred embodiment, the method allows for first deposition of the back facet, reconfiguring the bar fixture to expose the front facet, and second deposition of the front facet without breaking vacuum. In a preferred embodiment, the method allows for deposition of one or more films on front and back without breaking vacuum to save time and improve efficiency. Other embodiments can break vacuum. Of course, there can be other variations, modifications, and alternatives.

FIG. 12 illustrates a method directed to singulate bars into a plurality of die according to a specific embodiment. This diagram is merely an illustration and should not unduly limit the scope of the claims herein. One of ordinary skill in the art would recognize other variations, modifications, and alternatives. After the facets of the bars have been coated, the method includes testing the laser devices in bar form prior to die singulation. In a specific embodiment, the method singulates the bars by performing a scribe and break process (similar to the facet cleave). Preferably, the method forms a shallow continuous line scribe on the top side of the laser bar according to a specific embodiment. The width of each die is about 200 um, which may reduce the support gap to 300 um or so. After the bars have been cleaved into individual die, the tape is expanded and each of the die is picked off of the tape. Next, the method performs a packing operation for each of the die according to one or more embodiments.

The above sequence of steps is used to form individual laser devices on a die from a substrate structure according to one or more embodiments of the present invention. In one or more preferred embodiments, the method includes cleaved facets substantially parallel to each other and facing each other in a ridge laser device configured on a non-polar gallium nitride substrate material. Depending upon the embodiment, one or more of these steps can be combined, or removed, or other steps may be added without departing from the scope of the claims herein. One of ordinary skill in the art would recognize other variations, modifications, and alternatives. Further details of this method are provided throughout the present specification and more particularly below.

In a preferred embodiment, the present invention provides a method for forming a contact (e.g., n-type) to one or more of the present nonpolar laser diodes, light emitting diodes, and other applications using a laser scribe technique. We discovered that it was difficult to form an n-contact to nonpolar and semipolar GaN surfaces after wafering, lapping, or polishing. Each of these processes creates surface crystalline damage that can result in a Schottky contact. It was desired to propose techniques to remove the crystalline damage and/or improve contact characteristics. Further, it is believed that making a good n-contact to nonpolar substrates is a difficult task even without the presence of crystal damage.

In one or more embodiments, the present method uses wet etching and/or dry etching of the damaged surface prior to depositing the n-contact to remove the damage. However, there are few wet chemistries that actually etch GaN, and the wet etches that we evaluated actually resulted in a degraded n-contact resistance. More specifically, as examples, KOH, $HPO_4$, and $HNO_3$ based wet etch treatments were used. In one or more embodiments, the present method uses dry etching including etching gases such as $Cl_2$, Ar, and $BCl_3$, which slightly improved the surface, but the contacts were still slightly Schottky. Of course, there can be other variations, modifications, and alternatives.

In one or more preferred embodiments, the present method uses a laser scribing technique for contact formation. After repeated efforts to form ohmic contacts to the bulk GaN substrates, we discovered that if the substrate is laser scribed before or after the contact metallization is deposited, the contact resistance can be greatly reduced. That is, by laser scribing the backside, we made desirable ohmic contacts to surfaces that have been subjected to a lapping process, a polishing process, both a lapping and a polishing process, and KOH etched, although there may also be other combinations. Further details of the present laser scribing technique can be found throughout the present specification and more particularly below.

In a preferred embodiment, the present invention uses a laser scriber technique and system. The laser scriber system is generally used in a scribe and break process, which is similar to the one for creating laser diode facets or to singulate laser die and LED die, according to one or more embodiments. As an example, the scribe tool is configured with a 355 nm UV laser and an XY table. The scribe tool is configured to form various scribe patterns and depths in the GaN substrate material. Of course, other scribe tools can be used.

In one or more embodiments, the scribe process can be applied to either or both pre-metallization and post-metallization. We initially discovered the scribe process when singulating laser die using a laser scribe on the backside of laser devices, which were metalized. We discovered a large voltage drop across the laser device when using the laser scribe process for die singulation. It was initially thought the laser scribe was locally alloying the material in the scribe line. We also evaluated the laser scribe pre-metallization and observed similar characteristics, so it is modifying the GaN as well.

It is not clear about the mechanism that generates the good ohmic contact from laser scribing. The laser scribing could be benefiting the contact through locally heat treatment of the semiconductor by annealing damaged material, by creating some beneficial elemental diffusion profile, creating a gallium rich metallic surface, recrystallizing the damaged surfaces, or other influences. The laser scribe could also create a gallium rich spike that penetrates the damaged material into the undamaged bulk material. Or it could be something entirely different that is independent of damage, such as exposing one or more additional crystallographic planes to contact or creating some highly conductive layer in the vicinity of the scribe. That is, the overlying contact metallization is formed overlying the substrate, edges of scribe region, and bottom region of trenched region. In one or more embodiments, the bottom and/or edges may expose additional crystallographic planes. Of course, the benefit could be resulting from any combination of the above or others characteristics. According to one or more embodiments, the present backside contact process for lasers is described below.

1. Lap GaN substrates with a 5 um SiC (e.g., Logitech) or suitable slurry on cast iron lapping plate from ~330 um to 80 um, but can be others;
2. Polish substrates with colloidal silica (e.g., Eminess Tech, 300K or others) on Politex (e.g., Rodel) pad from 80 um to 70 um, but can be others;
3. Perform backside laser scribe on the entire backside of the substrate parallel to the laser ridges: 2 to 20 mm/s feed rate, 10 to 50 mW power, 10 to 100 um pitch (although there may be other variation, modifications, and alternatives). This generates a continuous scribe that is ~3-5 um deep.
4. HCl dip to remove excess surface slag;
5. HF dip to remove colloidal silica from polish;
6. Sputter Al/Ni/Au to form contact region; and
7. Perform other steps, as desired Although the above has been described in terms of one or more specific embodiments, there could be many other variations, alternatives, and modifications. Such alternative embodiments may include but are not limited to:

1. Using any metal stack as the n-contact, e.g., Al/Ni/Au, Al/Pt/Au, Ti/Pt/Au;
2. Performing the laser scribe after the metal is deposited in a different sequence from the above;
3. Not including a lapping and/or polishing step, which may also be replaced with one or more other processes;
4. Lapping to different thicknesses;
5. Using some other agent(s) to remove surface slag such as HF or other combinations of etchants, cleaning solutions, slurries, and the like;
6. Not removing the surface slag;
7. Using alternative laser power settings;
8. Using a laser scribe pattern;
9. Using nonpolar or semipolar substrates;
10. Using low laser power settings to locally heat the material, not create a scribe; and
11. Other desired processes.

The above sequence of steps is used to form individual laser devices on a die from a substrate structure according to one or more embodiments of the present invention. In one or more preferred embodiments, the method includes laser scribed backside regions for improved contact formation configured on a non-polar gallium nitride substrate material. Depending upon the embodiment, one or more of these steps can be combined, or removed, or other steps may be added without departing from the scope of the claims herein. One of ordinary skill in the art would recognize other variations, modifications, and alternatives. Further details of this method are provided throughout the present specification and more particularly below.

In one or more other embodiments, the present invention performs backside die singulation with the laser scriber for only die singulation purposes. In one or more embodiments, the present method and structure can provide for a laser scribed contact, which has improved conductivity. Of course, there can be other variations, modifications, and alternatives. Further details of the present method can be described by way of the Figures below.

FIGS. 13 to 18 illustrate a simplified laser scribe process for improving contact regions of an optical device according to one or more embodiments of the present invention. These diagrams are merely illustrations and should not unduly limit the scope of the claims herein. One of ordinary skill in the art would recognize other variations, modifications, and alternatives.

Mount to Carrier

After frontside processing, the GaN substrate is mounted frontside down onto a sapphire wafer with Crystalbond 509.

Lapping

The GaN substrate is thinned from ~330 um to 80 um by lapping with 5 um SiC on a cast iron plate. We use a Logitech lapping system and jig to perform this process. Note that the surface is rough after this process.

Polish

To remove surface roughness and subsurface damage, the GaN substrate is polished from 80 um to 70 um by polishing with colloidal silica on a polishing pad. We use a Logitech lapping system and jig to perform this process. The colloidal silica (300K) is manufactured by Eminess and pad (Politex) is manufactured by Rodel. Note that the surface is smooth, but small amounts of colloidal silica is still attached to the surface.

Laser Scribe

The laser scribe is performed on the backside of the substrate. The scribe parameters are: power: 25 mW, scan speed: 10 mm/s, pattern: continuous line on a 40 um pitch these lines are parallel to the ridges on the frontside. The scribe depth is ~3-5 um deep HCl and HF dip After the laser scribe, there is slag present on the surface. This is removed by a 5 min dip in HCl. In addition, we remove the colloidal silica with a 1 min dip in HF. This also helps remove any native oxides on the GaN surface.

N-Contact Deposition

The N-contact is deposited with our DC magnetron sputter system. The metal stack is the following: Al/Ni/Au 300/200/3000 A.

The above sequence of steps is used to form individual laser devices on a die from a substrate structure according to one or more embodiments of the present invention. In one or more preferred embodiments, the method includes laser scribed backside regions for improved contact formation configured on a non-polar gallium nitride substrate material. In one or more embodiments, one or more of the scribe lines is arranged in at least one spatial configuration including an annular segment, a circular segment, a straight line segment, an irregular line segment, or other combinations. Depending upon the embodiment, one or more of these steps can be combined, or removed, or other steps may be added without departing from the scope of the claims herein. One of ordinary skill in the art would recognize other variations, modifications, and alternatives. Further details of this method are provided throughout the present specification and more particularly below.

EXAMPLE

FIGS. 19, 20(A), and 20(B) are simplified diagram illustrating experimental results of a laser scribing process for contact formation according to one or more examples of the present invention. These diagrams are merely illustrations and should not unduly limit the scope of the claims herein. One of ordinary skill in the art would recognize other variations, modifications, and alternatives.

FIG. 19 shows an IV curve from a set of Transmission Line Models (TLM's) that were fabricated on top of 4 different GaN backside surfaces: lapped, lapped and laser scribed, lapped and polished, and lapped, polished and laser scribed. As used herein, TLM stands for Transmission Line Model, which is a measure technique for resistance of contacts along with the sheet resistance of the one or more materials having the deposited metallization contacts. Typically the measurements are performed by varying the distances between the two metal contacts and plotting resistance versus distance of the contacts. From the line that is formed on the plot, the contact resistance and the sheet resistance are deduced. As shown are current versus voltage curves in the plots. The curves are for the different n-contact schemes on the same or similar geometry/distance TLM feature deposited on the samples. The lower voltage for a fixed current or higher current for a fixed voltage for the laser scribed samples indicates lower resistance, which is likely mainly attributed to the lower contact resistance, but could also have some contribution from lower sheet resistance. The TLM pattern is circular with inner diameter of 100 um and 8 um spacing. For both lapped substrates and lapped and polished substrates, the contacts were drastically improved changing from a Schottky characteristic to an ohmic characteristic. Of course, there can be other variations, modifications, and alternatives.

FIG. 20(A) shows a cross-sectional optical image of the laser facet. The ridge can be seen on the front side (top) and the n-contact laser scribes can be seen on the backside (bottom). One can also see the front side (top) laser scribes that were used to create the facet. FIG. 20(B) shows an optical image of laser scribes on the backside of the laser. These scribes are spaced on a 40 um pitch and are continuous across the backside of the laser. Of course, there can be other variations, modifications, and alternatives.

In one or more embodiments, the present method is configured for laser diodes operating in the 390-420 nm range, 420-460 nm range, 460 nm-500 nm range, 500-540 nm range, and +540 nm range, combinations, and others. As an example, the laser diodes can also be configured with one or more of the following parameters:

Operating Current density range: 0.5-2 kA/cm2, 2-4 kA/cm2, 4-8 kA/cm2, 8-16 kA/cm2, +16 kA/cm2;
Operating Voltage range: 4-5V, 5-6V, 6-7V, 7-9V, +9V;
Series resistance range: 1-3 ohm, 3-6 ohm, 6-10 ohm, 10-15 ohm, +15 ohm;
Operating output power range: 0.5-5 mW, 5-25 mW, 25-75 mW, 75-150 mW, 150-500 mW, 500 mW-1 W, 1-5 W, +5 W; and
Other desirable features, including combinations.

In alternative embodiments, the laser diodes vary and may include single lateral mode, multi-lateral mode, laser arrays for high power, edge emitting, vertical cavity (VCSEL), combinations, and the like.

In alternative embodiments, the present method and device are configured for LEDS operating in the 390-420 nm range, 420-460 nm range, 460 nm-500 nm range, 500-540 nm range, and +540 nm range, combinations, and the like. As an example, the laser diodes can also be configured with one or more of the following parameters:

Operating Current density range: 0.1-0.3 kA/cm2, 0.3-0.5 kA/cm2, 0.5-1.0 kA/cm2, 1.0-2.0 kA/cm2, +2.0 kA/cm2;
Operating Voltage range (per single LED): 2.2-2.8V, 2.8-3.2V, 3.2-3.5V, 3.5-3.8V, 3.8-4.5V, 4.5-6.0V, +6V;
Operating Voltage range (for series connected LEDs or some other high voltage config): 4-12V, 12-24V, 24-48V, 48-96V, 96-140V, +140V;
Series resistance range: 0.1-0.3 ohm, 0.3-0.6 ohm, 0.6-1.0 ohm, 1-2 ohm, 2-5 ohms, 5-10 ohm, +10 ohm;
Operating output power range: 200-300 mW, 300-500 mW, 500 mW-1 W, 1-2 W, 2-5 W, 5-10 W, +10 W; and
Other desirable features, including combinations.

In alternative embodiments, the LEDs vary and may include low power, high power, different configurations of electrodes and active regions, combinations, and the like.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical device comprising:
    a gallium and nitrogen containing substrate member having a crystalline surface region and a backside opposite the crystalline surface region;
    a laser stripe region overlying a portion of the crystalline surface region;
    at least one laser scribe line on the backside and underlying at least a portion of the laser stripe region, the at least one laser scribe line comprising a recessed region extending partially through a thickness of the gallium and nitrogen containing substrate, wherein portions of the backside within a vicinity of the at least one laser scribe line have a higher conductivity than portions of the backside outside the vicinity of the at least one laser scribe line; and
    a metallization material contacting the backside and one or more portions of the at least one laser scribe line to form a metal contact.

2. The device of claim 1 wherein the metallization material comprises aluminum material.

3. The device of claim 1 wherein the metallization material comprises a gold material.

4. The device of claim 1 wherein the metallization material comprises a gold material and a nickel material.

5. The device of claim 1 wherein the metal contact is an n-type metal contact.

6. The device of claim 1 further comprising an n-type gallium nitride region overlying the crystalline surface region, an active region overlying the n-type gallium nitride region, and the laser stripe region overlying the active region.

7. The device of claim 6 wherein the active region comprises one to twenty quantum well regions, and is characterized by a thickness of 10 Angstroms to about 50 Angstroms.

8. The device of claim 6 wherein the active region comprises one to twenty quantum well regions, and is characterized by a thickness of 50 Angstroms to about 100 Angstroms.

9. The device of claim 6 wherein the active region comprises an electron blocking region.

10. The device of claim 6 wherein the active region comprises a separate confinement hetero-structure.

11. The device of claim 1, wherein the at least one laser scribe line is parallel to the laser stripe region.

12. The device of claim 1, wherein the at least one laser scribe line is 3 μm to 5 μm deep.

13. The device of claim 1, wherein the metallization material comprises a n-type contact.

14. The device of claim 1, wherein the substrate is a non-polar or a semipolar substrate.

15. The device of claim 1, wherein the substrate is an m-plane substrate.

16. The device of claim 1, wherein the at least one laser stripe region is substantially parallel to the c-direction.

17. The device of claim 1, wherein the metallization material contacts edges of the at least one laser scribe line.

18. The device of claim 1, wherein the optical device comprises a light emitting diode device.

19. The device of claim 1, wherein the optical device comprises a laser device.

20. The device of claim 1, wherein the crystalline surface region is configured in a non-polar orientation.

21. The device of claim 1, wherein the crystalline surface region is configured in a semi-polar orientation.

22. The device of claim 1, wherein the crystalline surface region is configured in an m-plane orientation having a +/−6 degree off-cut.

23. The device of claim 1, wherein the crystalline surface region is configured in a {20-21} orientation.

24. The device of claim 1, wherein the at least one laser scribe line comprises multiple laser scribe lines wherein each of the laser scribe lines is arranged in a parallel manner.

* * * * *